(12) United States Patent
Nagao

(10) Patent No.: US 9,975,274 B2
(45) Date of Patent: May 22, 2018

(54) PROCESSING APPARATUS

(71) Applicant: DISCO CORPORATION, Tokyo (JP)

(72) Inventor: Ryosuke Nagao, Tokyo (JP)

(73) Assignee: Disco Corporation, Tokyo (JP)

( * ) Notice: Subject to any disclaimer, the term of this patent is extended or adjusted under 35 U.S.C. 154(b) by 287 days.

(21) Appl. No.: 14/800,904

(22) Filed: Jul. 16, 2015

(65) Prior Publication Data

US 2016/0016331 A1 Jan. 21, 2016

(30) Foreign Application Priority Data

Jul. 18, 2014 (JP) .................................. 2014-147659

(51) Int. Cl.
*B25B 11/00* (2006.01)
*B28D 7/04* (2006.01)
*B24B 27/06* (2006.01)
*B24B 55/02* (2006.01)

(52) U.S. Cl.
CPC .......... *B28D 7/046* (2013.01); *B24B 27/0683* (2013.01); *B24B 55/02* (2013.01)

(58) Field of Classification Search
USPC ................................. 269/20, 21; 451/67, 88
See application file for complete search history.

(56) References Cited

U.S. PATENT DOCUMENTS

| 6,106,375 A * | 8/2000 | Furusawa ............... B24B 37/04 210/539 |
| 7,826,031 B2 * | 11/2010 | Hara ................... G03F 7/70991 355/30 |
| 9,216,442 B2 * | 12/2015 | Aizawa ..................... B08B 3/14 |
| 2008/0150207 A1 * | 6/2008 | Fukano ................ B25B 11/005 269/21 |

FOREIGN PATENT DOCUMENTS

| JP | 2012-151263 | 8/2012 |
| JP | 2014-34068 | 2/2014 |
| WO | 2005/003043 A1 | 1/2005 |

* cited by examiner

*Primary Examiner* — Joseph J Hail
*Assistant Examiner* — Shantese McDonald
(74) *Attorney, Agent, or Firm* — Greer Burns & Crain Ltd.

(57) ABSTRACT

A processing apparatus includes a chuck table for holding a plate-like workpiece under suction. A suction unit is connected to the chuck table, and a processing unit is configured to process the workpiece while supplying processing water to the workpiece. The suction unit includes a first suction source, a first pipe providing fluid communication between the first suction source and the chuck table, a separator arranged in the first pipe, for separating a gas and a liquid drawn in from the chuck table, and a water discharging unit configured to discharge the liquid separated by the separator. The water discharging unit includes a second suction source, a second pipe providing fluid communication between the second suction source and a water discharge port of the separator, and a check valve arranged in the second pipe, for preventing a fluid from flowing from the second suction source to the separator.

2 Claims, 3 Drawing Sheets

PROCESSING APPARATUS

BACKGROUND OF THE INVENTION

Field of the Invention

The present invention relates to a processing apparatus for processing a plate-like workpiece held under suction by a chuck table while supplying processing water to the planar workpiece.

Description of the Related Art

Cutting apparatus for rotating a cutting blade and forcing the cutting blade into a plate-like workpiece such as a semiconductor wafer or the like to cut the plate-like workpiece use a chuck table for holding the plate-like workpiece under suction. The chuck table employs, as a suction source, an ejector for attracting the plate-like workpiece under a negative pressure that is developed when air flows (see, for example, Re-publication of PCT International Publication No. 2005-3043).

Processing apparatus that process a workpiece with a grinding wheel such as a cutting blade or the like, as is the case with the above cutting apparatus, use processing water for cooling the grinding wheel. During operation, the processing water finds it way between the upper surface of the chuck table and the lower surface of the wafer, and is drawn in by the chuck table. The processing water thus drawn in obstructs the flow of air from the ejector, tending to lower the suction force generated by the chuck table. One solution to the problem has been proposed to insert a separator in the pipe that interconnects the chuck table and the suction source, for separating the introduced processing water to prevent the suction force from being reduced (see, for example, Japanese Patent Laid-open No. 2014-34068 and Japanese Patent Laid-open No. 2012-151263).

SUMMARY OF THE INVENTION

If the separator has its water discharge port left open, then air flows through the water discharge port into the separator thereby to reduce the suction force. Therefore, the water discharge port needs to be closed. However, if the water discharge port is closed, then the separated processing water remains trapped in the separator. Therefore, when the processing of the plate-like workpiece is finished, the water discharge port is opened to discharge the trapped processing water from the separator. When the discharging of the processing water is finished, the water discharge port is closed again after which a next plate-like workpiece starts to be processed. Since a next plate-like workpiece cannot be processed until the trapped processing water is fully discharged from the separator, the number of plate-like workpieces that can be processed per unit time by the processing apparatus is relatively small.

It is, therefore, an object of the present invention to provide a processing apparatus in which a plate-like workpiece to be processed is held by a chuck table and which is capable of processing an increased number of workpieces per unit time without causing a reduction in the suction force under which the plate-like workpieces are held by the chuck table.

In accordance with an aspect of the present invention, there is provided a processing apparatus including a chuck table for holding a plate-like workpiece under suction, suction means connected to the chuck table, for causing the chuck table to generate a suction force, and processing means for processing the plate-like workpiece held by the chuck table while supplying processing water to the plate-like workpiece, wherein the suction means includes a first suction source, a first pipe providing fluid communication between the first suction source and the chuck table, a separator arranged in the first pipe, for separating a gas and a liquid drawn in from the chuck table, and water discharging means for discharging the liquid separated by the separator, and the water discharging means includes a second suction source, a second pipe providing fluid communication between the second suction source and a water discharge port of the separator, and a check valve arranged in the second pipe, for preventing a fluid from flowing from the second suction source to the separator.

Preferably, each of the first suction source and the second suction source includes an air supply source and an ejector for drawing in a fluid under a negative pressure generated by a flow of air supplied from the air supply source.

Preferably, the water discharging means includes a trapped liquid level sensor for detecting the amount of liquid trapped in the separator, a pressure sensor for detecting the pressure in the first pipe, a decision unit configured to determine whether the amount of liquid detected by the trapped liquid level sensor has exceeded a predetermined amount or not and to determine whether the pressure detected by the pressure sensor is lower than a predetermined value or not, and a switching controller for operating the second suction source if the decision unit decides that the amount of liquid detected by the trapped liquid level sensor has exceeded the predetermined amount, and shutting down the second suction source if the decision unit decides that the pressure detected by the pressure sensor is lower than the predetermined value.

With the processing apparatus according to the present invention, since the separator separates a liquid such as processing water from air drawn in by the first suction source, the suction force generated by the suction means is prevented from being lowered. As the check valve prevents a fluid from flowing from the water discharge port of the separator into the first pipe, the suction force generated by the suction means is prevented from being lowered. Furthermore, inasmuch as the liquid trapped in the separator is not drained of its own accord, but is forcibly discharged by the second suction source, the suction force generated by the suction means is prevented from being lowered. Since the liquid can be discharged from the chuck table while the plate-like workpiece held by the chuck table is being processed, it is not necessary to wait until the liquid is fully drained from the separator. Consequently, the number of plate-like workpieces that can be processed per unit time by the processing apparatus can be increased.

If the amount of liquid trapped in the separator exceeds the predetermined amount, then the second suction source is actuated, and if the liquid trapped in the separator is fully discharged, then the second suction source is shut down. Since the second suction source is thus efficiently operated, the energy efficiency of the processing apparatus is increased.

The above and other objects, features, and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
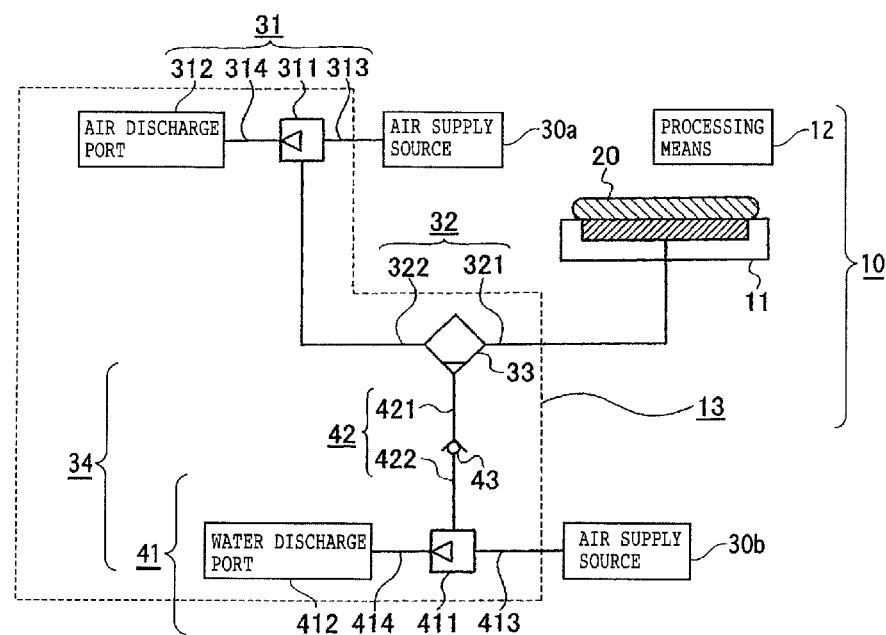
FIG. 1 is a block diagram showing a configuration of a processing apparatus according to an embodiment of the present invention.

FIG. 1 shows a processing apparatus 10 according to an embodiment of the present invention. The processing apparatus 10 is an apparatus for processing, e.g., cutting, grinding, or polishing, a plate-like workpiece 20. The processing apparatus 10 includes a chuck table 11 for holding the plate-like workpiece 20 under suction, suction means 13 connected to the chuck table 11, and processing means 12 for processing the plate-like workpiece 20 that is held by the chuck table 11. The processing means 12 includes, for example, cutting means for forcing a cutting blade having a cutting wheel (cutter) into the plate-like workpiece 20 to cut the plate-like workpiece 20. The processing means 12 uses processing water to cool the cutting wheel and processes the plate-like workpiece 20 while supplying the processing water to the plate-like workpiece 20.

The suction means 13 serves to draw in air from the chuck table 11 to cause the chuck table 11 to generate a suction force. The suction means 13 includes a first suction source 31 for drawing in air, a first pipe 32 that provides fluid communication between the first suction source 31 and the chuck table 11, a separator 33 for separating a gas and a liquid drawn from the chuck table 11 from each other, and water discharging means 34 for discharging the liquid separated by the separator 33.

The first suction source 31 includes an ejector 311 for generating a negative pressure by a flow of air supplied from an air supply source 30a, an air discharge port 312 for discharging air, a pipe 313 that provides fluid communication between the air supply source 30a and the ejector 311, and a pipe 314 that provides fluid communication between the ejector 311 and the air discharge port 312. The first pipe 32 includes a pipe 321 that provides fluid communication between the chuck table 11 and the separator 33 and a pipe 322 that provides fluid communication between the separator 33 and the ejector 311. Therefore, the separator 33 is arranged halfway in the pipe 32.

The water discharging means 34 includes a second suction source 41 for drawing in the liquid separated by the separator 33, a second pipe 42 that provides fluid communication between the separator 33 and the second suction source 41, and a check valve 43 for preventing a fluid (air) from flowing from the second suction source 41 to the separator 33 through the second pipe 42. The second suction source 41 includes an ejector 411 for generating a negative pressure by a flow of air supplied from an air supply source 30b, a water discharge port 412 for discharging air and a liquid, a pipe 413 that provides fluid communication between the air supply source 30b and the ejector 411, and a pipe 414 that provides fluid communication between the ejector 411 and the water discharge port 412.

The second pipe 42 includes a pipe 421 that provides fluid communication between the separator 33 and the check valve 43 and a pipe 422 that provides fluid communication between the check valve 43 and the ejector 411. Therefore, the check valve 43 is arranged halfway in the second pipe 42. The check valve 43 may be coupled to the separator 33 insofar as the check valve 43 is connected to the second pipe 42.

When the first suction source 31 is actuated, it generates a suction force in the chuck table 11 through the first pipe 32 and the separator 33. Air that is drawn in from the chuck table 11 contains processing water that is supplied from the processing means 12. The liquid that includes the processing water contained in the air is separated by the separator 33 and remains trapped in the separator 33. When the second suction source 41 is actuated, it draws in the liquid trapped in the separator 33 through the second pipe 42 and the check valve 43, and discharges the liquid from the water discharge port 412. The second pipe 42 is connected at a height capable of discharging the liquid including the processing water trapped in the separator 33, whereas the first pipe 32 is connected at a height incapable of drawing in the processing water trapped in the separator 33, i.e., higher than the position where the second pipe 42 is connected to the separator 33.

Figure 2:
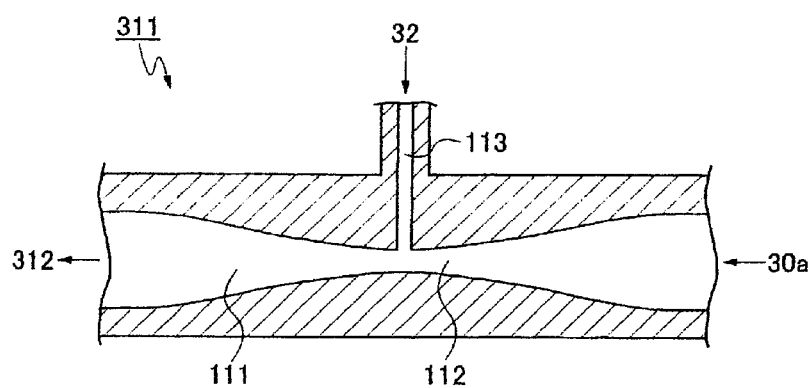
FIG. 2 is an enlarged fragmentary cross-sectional view showing an ejector of the processing apparatus in FIG. 1.

As shown in FIG. 2, the ejector 311 has a passageway 111 through which air supplied from the air supply source 30a flows and a suction passage 113 connected to the first pipe 32. The passageway 111 includes a constriction 112 having a smaller cross-sectional area. The constriction 112 makes air flow at a higher speed, generating a negative pressure. The suction passage 113 is connected substantially perpendicularly to the passageway 111 at the area of the constriction 112. Air is drawn from the first pipe 32 into the passageway 111 under the negative pressure generated by the constriction 112. The air drawn in from the first pipe 32 is discharged, together with the air supplied from the air supply source 30a, from the air discharge port 312. The ejector 411 is same in structure to the ejector 311.

If a liquid is mixed in the air drawn in from the first pipe 32, the suction force generated in the chuck table 11 is lowered. The separator 33 arranged halfway in the first pipe 32 separates the liquid including the processing water from the air from the chuck table 11, thereby preventing the suction force from being lowered. The liquid separated by the separator 33 is drawn off by the second suction source 41 and discharged from the water discharge port 412. Since the separator 33 is not filled with the liquid, it is not necessary to wait until the liquid is drained from the separator 33. Consequently, the plate-like workpiece 20 can continuously be processed by the processing means 12, with the result that an increased number of plate-like workpieces 20 can be processed per unit time.

The second suction source 41 has its suction force lowered by drawing in the liquid separated by the separator 33. However, since the second suction source 41 serves to discharge the liquid separated by the separator 33, it does not adversely affect the suction force generated in the chuck table 11 even if the suction force generated by the second suction source 41 is lowered. The second suction source 41 may be actuated continuously or intermittently at given intervals. Even when the second suction source 41 stops drawing in the liquid separated by the separator 33, the check valve 43 that is arranged halfway in the second pipe 42 prevents ambient air from flowing from the second pipe 42 into the first pipe 32, so that the suction force generated in the chuck table 11 is not lowered. If the second suction source 41 operates only when necessary, the energy consumed by the second suction source 41 is prevented from being wasted.

A single common air supply source may be used as both the air supply source 30a connected to the first suction source 31 and the air supply source 30b connected to the second suction source 41. The first suction source 31 and the second suction source 41 are not limited to those including the ejector, but may be of other types.

Figure 3:
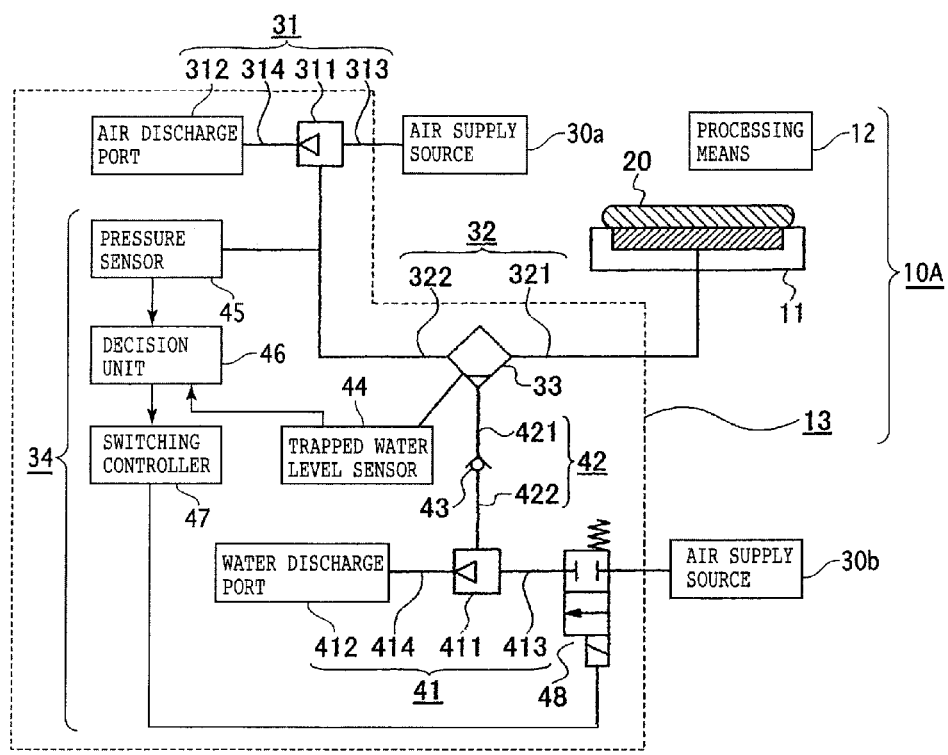
FIG. 3 is a block diagram showing a configuration of the processing apparatus according to another embodiment of the present invention.

FIG. 3 shows a processing apparatus 10A according to another embodiment of the present invention. As shown in FIG. 3, the processing apparatus 10A includes, in addition to the components of the processing apparatus 10 in FIG. 1, a trapped liquid level sensor 44 for detecting the amount of liquid trapped in the separator 33, a pressure sensor 45 for detecting the pressure in the first pipe 32, a decision unit 46 for determining whether the amount of liquid detected by the trapped liquid level sensor 44 has exceeded a predetermined amount or not and also for determining whether the pressure detected by the pressure sensor 45 is lower than a predetermined value or not, a solenoid-operated valve 48 arranged halfway in the pipe 413, and a switching controller 47 for controlling the solenoid-operated valve 48.

When the solenoid-operated valve 48 is closed, the second suction source 41 is not actuated because no air is supplied from the air supply source 30b to the second suction source 41. Therefore, the liquid trapped in the separator 33 is not discharged, and the separator 33 continues to trap the liquid separated thereby. When the amount of liquid trapped in the separator 33 exceeds the predetermined amount, the decision unit 46 detects the exceeding level and sends a signal to the switching controllers 47, which controls the solenoid-operated valve 48 to open. Now, air is supplied from the air supply source 30b to the second suction source 41, which is actuated to discharge the trapped liquid from the separator 33.

When the trapped liquid is fully discharged from the separator 33, the pressure detected by the pressure sensor 45 is lowered. If the decision unit 46 decides that the detected pressure value is lower than the predetermined value, then the decision unit 46 determines that no liquid is trapped in the separator 33 and sends a signal to the switching controllers 47, which controls the solenoid-operated valve 48 to close. As the solenoid-operated valve 48 is closed, air stops being supplied from the air supply source 30b to the second suction source 41, which is shut down.

Since the amount of liquid trapped in the separator 33 is detected and the second suction source 41 is controlled on the basis of the detected amount of liquid trapped in the separator 33, the separator 33 is prevented from being filled with the processing water, and the suction force generated in the chuck table 11 is prevented from being reduced. Inasmuch as the second suction source 41 can operate only when necessary, it acts as an energy saver.

The second suction source 41 may be shut down when the amount of liquid trapped in the separator 33 becomes smaller than the predetermined amount, rather than when the trapped liquid is fully discharged from the separator 33. According to the second embodiment, the second suction source 41 is shut down by closing the solenoid-operated valve 48 to stop supplying air from the air supply source 30b. However, the second suction source 41 may be shut down in other ways.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
 a chuck table for holding a plate-like workpiece under suction;
 suction means connected to said chuck table, for causing said chuck table to generate a suction force; and
 processing means for processing the plate-like workpiece held by said chuck table while supplying processing water to the plate-like workpiece; wherein
 said suction means includes:
 a first suction source;
 a first pipe providing fluid communication between said first suction source and said chuck table;
 a separator arranged halfway in said first pipe, for separating a gas and a liquid drawn in from said chuck table; and
 water discharging means for discharging the liquid separated by said separator;
 said water discharging means includes:
 a second suction source;
 a second pipe providing fluid communication between said second suction source and a water discharge port of said separator;
 a trapped liquid level sensor for detecting the amount of liquid trapped in said separator;
 a pressure sensor for detecting the pressure in said first pipe;
 a decision unit configured to determine whether the amount of liquid detected by said trapped liquid level sensor has exceeded a predetermined amount or not and to determine whether the pressure detected by said pressure sensor is lower than a predetermined value or not; and
 a switching controller for operating said second suction source if said decision unit decides that the amount of liquid detected by said trapped liquid level sensor has exceeded the predetermined amount, and shutting down said second suction source if said decision unit decides that the pressure detected by said pressure sensor is lower than the predetermined value, the processing apparatus further having
 a check valve arranged in said second pipe, for preventing a fluid from flowing from said second suction source to said separator.

2. The processing apparatus according to claim 1, wherein each of said first suction source and said second suction source comprises an air supply source and an ejector for drawing in a fluid under a negative pressure generated by a flow of air supplied from said air supply source.

\* \* \* \* \*